United States Patent [19]

Banerjee et al.

[11] Patent Number: 4,817,054
[45] Date of Patent: Mar. 28, 1989

[54] HIGH SPEED RAM BASED DATA SERIALIZERS

[75] Inventors: Pradip Banerjee, Sunnyvale; Paul D. Keswick, San Jose, both of Calif.

[73] Assignee: Advanced Micro Devices, Inc., Sunnyvale, Calif.

[21] Appl. No.: 805,164

[22] Filed: Dec. 4, 1985

[51] Int. Cl.⁴ .............................................. G11C 7/00
[52] U.S. Cl. ..................................... 365/189; 365/230; 365/221; 365/239; 340/799
[58] Field of Search ............... 365/221, 219, 239, 240, 365/189, 78, 230, 233; 340/750, 799, 801

[56] References Cited

U.S. PATENT DOCUMENTS 4,361,869 11/1982 Johnson et al. .................... 364/200
4,433,394 2/1984 Torii et al. ........................... 365/221
4,685,088 8/1987 Iannucci ............................. 365/230

FOREIGN PATENT DOCUMENTS 0049073 4/1980 Japan .................................. 365/233

Primary Examiner—Stuart N. Hecker
Assistant Examiner—Glenn A. Gossage
Attorney, Agent, or Firm—Fliesler, Dubb, Meyer & Lovejoy

[57] ABSTRACT

Multiple bit parallel data serializers are described for accessing data serially through a port at high video data rates. The serializer preferably comprises a buffer array for storing data at a plurality of SRAM memory locations, sense amplifiers for sensing the stored data, an address decoder for selecting a predetermined memory location of the buffer array for data access by the sense amplifiers, a data latch for the latched buffering of data prior to output to the serial port and a control gate for enabling the gated transfer of data between the sense amplifiers and the output latch.

11 Claims, 7 Drawing Sheets

HIGH SPEED RAM BASED DATA SERIALIZERS

FIELD OF THE INVENTION

The present invention generally relates to data storage chip-architectures utilized in support of the serial data stream requirement of high resolution video displays and, in particular, to a high video speed, static RAM based data serializer chip architecture capable of supporting a bi-directional serial data stream at rates at or above that for high resolution video displays.

BACKGROUND OF THE INVENTION

Typical high resolution video and videographic displays are based on CRT technology. Such displays require the provision of a serial data stream at a rate essentially matching the horizontal sweep speed of the CRT electron beam to provide the desired horizontal pixel display density. Current graphic video displays are typically providing display resolutions of 1280 (horizontal) by 1024 (vertical) pixel densities. Accordingly, for a display refresh rate of 30 frames per second, a maximum pixel update period of 25 nanoseconds must be supported. However, given the presence of frame margins and the requirement for beam retrace, each pixel refresh period is typically closer to 10 nanoseconds. Naturally, as display resolution increases, the pixel refresh period correspondingly diminishes.

Additionally, with increasing resolution of the video display, the corresponding video memory requirements will also increase. For a 1280 by 1024 video display resolution, a multiple bit per pixel video memory is often at least 160 k byte. Given considerations such as the use of multiple bits per pixel to support color and other video attributes and the use of a video memory field several times larger than the actual video display, video memory requirements of several megabytes are typical.

Another constraint on the management of video memories is the quite limited period available for video memory updating. That is, the only time available for altering the contents of the video memory field is during the electron beam retrace period which is typically only about ten percent of real time. Any video memory updating that occurs during the remaining 90% of real time ordinarily conflicts with the transfer of data from the memory field to the display via the electron beam. Such conflicts typically result in the occurrence of a visibly perceptible flicker of the display. However, limiting the update of the video memory field to only the retrace period greatly limits the rate at which the video memory field can be updated.

Consequently, various schemes for providing extended memory field update periods while meeting the necessary pixel refresh period requirements without incurring undesirable video effects have been proposed and implemented. One such solution is to provide an alternate video memory field, or alternate video memory page. Control circuitry associated with the two video pages allows one page to be always available for supporting the video display while the second page is available for video memory field updating. The two pages may then be simply swapped during the retrace period of the video display. Disadvantages of this approach include the complete doubling of the required video memory field size and the lack of any provision to enhance the video memory field access speed for pixel updates. Relative to both of these disadvantages is the fact that with increasing display resolutions this two page approach has an increasing requirement for high speed memory that is naturally of similarly increasing cost.

Another approach is to utilize a high speed serial shift register in conjunction with a simple video memory field. This approach utilizes successive parallel shifts of data to fill the serial shift register with each parallel shifted line of data corresponding to a line of a video memory field portion to be displayed. Serially clocking the data out of the serial shift register supports the serial stream requirements of the display while substantially increasing the amount of the display frame period available for updating the video memory field. Further, the serial shift register may be optimized for serial shift speed and, thereby, meet the required maximum pixel update period dictated by the video display horizontal resolution. The disadvantages of this approach generally surface when the display memory field, or at least a portion thereof, is implemented along with the serial shift register in a single chip architecture. In particular, the disadvantages include the requirement that each and every segment of the serial shift register be operational and, further, operable at a minimum shift speed sufficient to support at least the maximum pixel refresh period of the video display. However, utilization of redundant shift register segments is typically ineffective, i.e., replacement segment routing introduces significant serial shift delays. Additionally, the dedicated, sequential nature of the serial shift register also imposes a severe constraint on the implementation of any redundancy scheme for the accompanying on-chip portion of the video memory field. Another disadvantage is that in the optimization of the serial shift register for speed, the power requirements of the shift register circuitry are significantly increased. As such, the extent and complexity of the remaining on-chip circuitry is correspondingly reduced.

SUMMARY

A general purpose of the present invention, therefore, is to provide a high speed data serializer well suited for implementation in a single chip architecture.

This is accomplished in the present invention by the provision of an apparatus for accessing data serially through a port at high video data rates, the apparatus comprising a buffer array for storing data at a plurality of memory locations, sense amplifiers for sensing the stored data, an address decoder for selecting a predetermined memory location of the buffer array for data access, a latch for the latched buffering of data prior to output to the serial port and a control gate for the gated transfer of data between the sense amplifiers and the output latch.

Thus, an advantage of the present invention is that it relieves the data access speed constraint of the video display memory field while continuing to provide data at rates sufficient to readily support the maximum pixel update period.

Another advantage of the present invention is that it achieves higher serial data rates while reducing the constraints on the implementation of a video memory field redundancy scheme and, further, permits redundancy in the implementation of the chip-architecture portion responsible for the serialization of video data.

A further advantage of the present invention is that it is capable of fully bi-directional serial operation with the write data path fully supporting the read data path rate.

Still another advantage of the present invention is that it provides a multiple bit wide serial data stream that may be further serialized in parallel with identical chip-architecture data serializers to further increase the ultimately available data rate.

Yet another advantage of the present invention is that it reduces the serial data access period to essentially that of the output transfer speed of a dedicated latch.

A still further advantage of the present invention is that it obtains substantial power conserving operation including complete data line equalization in preparation for sensing data.

BRIEF DESCRIPTION OF THE DRAWINGS

These and other attendant features of the present invention will become apparent and readily appreciated as the same becomes better understood by reference to the following detailed description of the invention when considered in conjunction with the accompanying drawings, wherein like reference numerals designate like parts throughout the figures, and wherein.

DETAILED DESCRIPTION OF THE INVENTION

Figure 1:
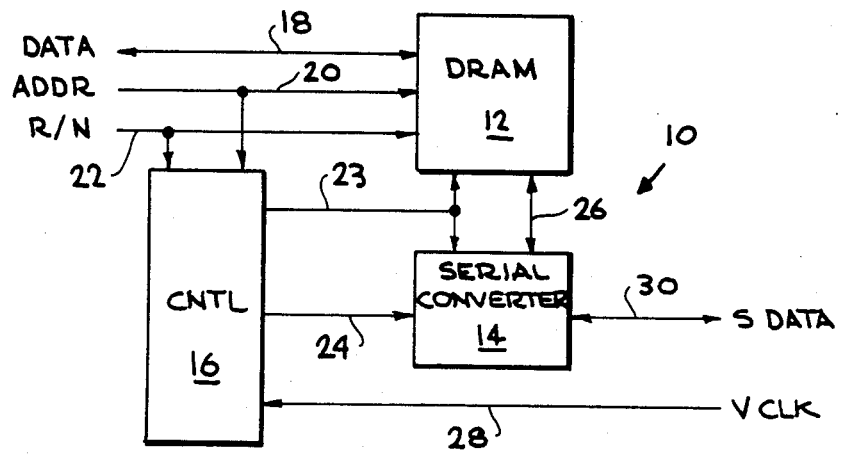
FIG. 1 is a simplified block diagram of a single chip architecture consistent with a preferred implementation of the present invention.

The application for which the present invention was initially conceived is generally illustrated in FIG. 1. As shown, the present invention is embodied in a single chip-architecture, dual-port video random access memory (RAM) circuit 10. The present invention, however, is not limited in any way to only video applications, but rather may be readily utilized in a wide variety of applications wherein the serialization or deserialization of a data stream is required, including communication network data transceivers, signal processing and any other application where continuous parallel/serial data conversion and buffering is required. With the wide applicability of the present invention in mind, embodiments of the present invention directed toward its preferred application will now be described.

As shown in FIG. 1, the serializer and buffer 10 includes dynamic random access memory (DRAM) array 12, preferably having a memory storage capacity of 256 k bit organized as 64 k×4. Data may be communicated in parallel to the DRAM 12 via a parallel data bus 18 with source and destination locations being designated in response to an address provided on an address bus 20. Read and write control signals are provided on a control line 22 to the DRAM 12 to select a particular parallel data transfer direction. A serial converter 14 is provided to perform serial-to-parallel and parallel-to-serial data conversions. Data transfers between the DRAM 12 and serial converter 14 occur over a wide parallel bus 26 having a parallel transfer capacity, preferably, of 1024 bits. Preferably, the serial converter 14 includes a 256×4 bit data array operable as four parallel operating 256 bit linear serializers.

A controller 16 is provided to manage the serial converter 14 via control signals passed thereto over control lines 24. The controller 16 receives a video clock ($V_{CLK}$) signal via line 28 with which serial data is synchronized as it is transferred to and from the serial converter 14 via a serial data bus 30. Additionally, the controller 16 coordinates the wide parallel data transfers between the DRAM 12 and serial converter 14 by the provision of control signals via the control lines 23 to the DRAM 12 and serial converter 14. The read/write control signal is also provided to the controller 16, via line 22, to aid in selecting between internal and external data accesses of the DRAM 12.

Figure 2:
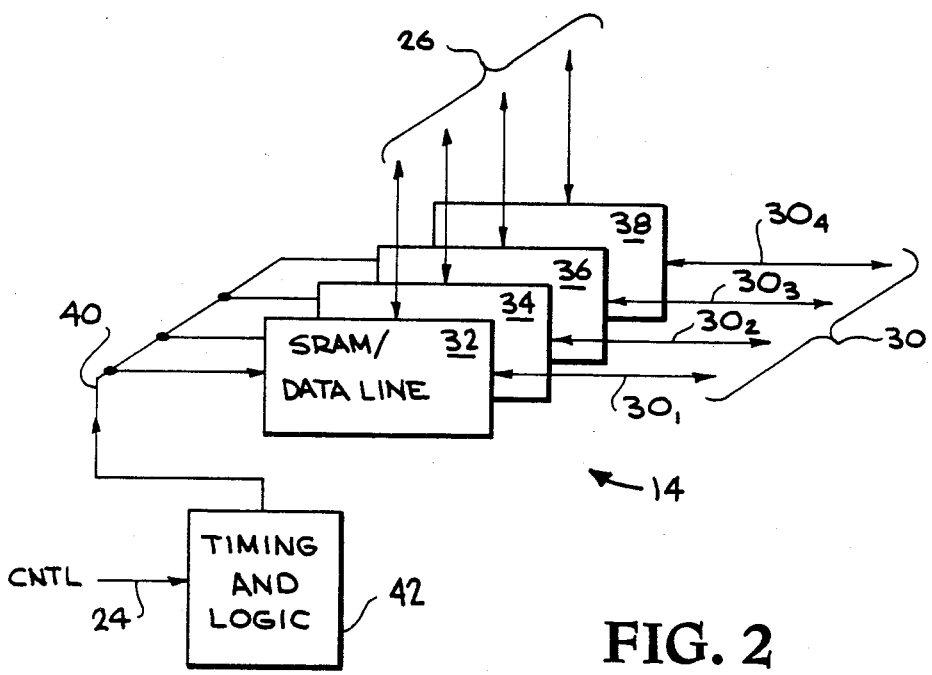
FIG. 2 is a simplified block diagram detailing the serializer portion of the block diagram of FIG. 1.

The serial converter 14 is illustrated in greater detail in FIG. 2. The serial converter 14 preferably includes a timing and logic block 42 and an array of static RAM (SRAM)/data line units 32, 34, 36, 38. In a preferred embodiment of the present invention, 256 bit wide portions of the wide parallel data bus 26 are connected to the respective SRAM/data line units 32, 34, 36, 38 which are, in turn, respectively coupled to the serial bit lines $30_{1-4}$ making up the serial data bus 30. Operation of the SRAM/data line units 32, 34, 36, 38 is controlled by the timing logic unit 42. A number of clocked signals are provided by the timing logic unit 42 via the clock lines 40 in response to the control signals received via the control lines 24.

As the four SRAM/data line units 32, 34, 36, 38 preferably operate in parallel, a four-bit wide "serialized" data stream is supported via the serial lines $30_{1-4}$. In accordance with the present invention, this is referred to as a multiple bit serial data stream.

Figure 3A:
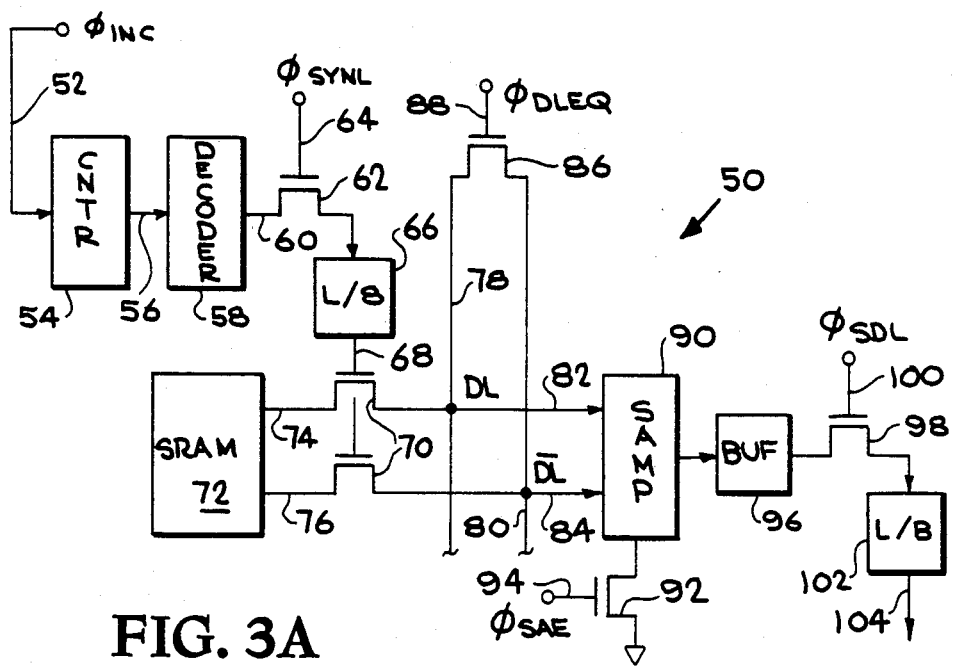
FIGS. 3a and 3b provide a detailed block diagram and graphical representation, respectively, of the operation of a first preferred embodiment of the present invention.

A portion of a preferred SRAM/data line unit 50 is illustrated in FIG. 3a. A programmable counter 54, responsive to an increment clock signal ($\phi_{INC}$) provided on clock line 52, provides its count value as an address to a decoder 58 via lines 56. The decoder 58 in turn provides a select signal on one of its decoder output lines, here represented by the output line 60. In a preferred embodiment, the decoder 58 is capable of providing a select signal on one of 256 output lines. For convenience, the single representative output line 60 is shown coupled through a respective pass gate 62 to a latched buffer 66. The pass gate 62 is controlled in response to another clock signal ($\phi_{SYNL}$) as provided on the gate control line 64. The select signal as latched into the latched buffer 66 is, in turn, provided on the gate control line 68 of pass gates 70. These pass gates 70 are coupled between an SRAM cell 72 via SRAM differential bit lines 74, 76 and the differential data lines 78, 80. Preferably, the pass gate 62, latching buffer 66, differential pass gates 70 and SRAM cell 72 are duplicated once for each decoded output of the decoder 58. Thus, in a preferred embodiment, a 256×1 bit SRAM array is coupled in common to the differential data lines 78, 80 with any SRAM cell 72 being randomly selectable in response to the programmed counter value provided to the decoder 58. That is, all of the pass gates 62 are enabled by $\phi_{SYNL}$, but only the decoded output of the decoder provides the SRAM select signal. Therefore, only a single corresponding SRAM cell 72 is coupled to the data lines 78, 80.

The differential data lines 78, 80 are interconnected by a pass gate 86 operated in response to an equalization clock signal ($\phi_{DLEQ}$) as provided on the gate line 88. The differential data lines 78, 80 are coupled, via the differential sense lines 82, 84 to a differential sense amplifier 90. A sense amplifier enable signal ($\phi_{SAE}$) is preferably provided on a gate control line 94 of an FET 92 coupled to the sense amplifier 90 to enable its sense amplifier operation. The output of the sense amplifier 90 is provided through a buffer 96, a pass gate 98, enabled by the provision of a sense data latch signal ($\phi_{SDL}$) on the gate line 100, and to a latched buffer 102. The data bit latched by the latch buffer 102 is then provided on an output line 104 to a final buffer driver (not shown) that drives the data onto a serial data port line $30_n$.

Figure 3B:
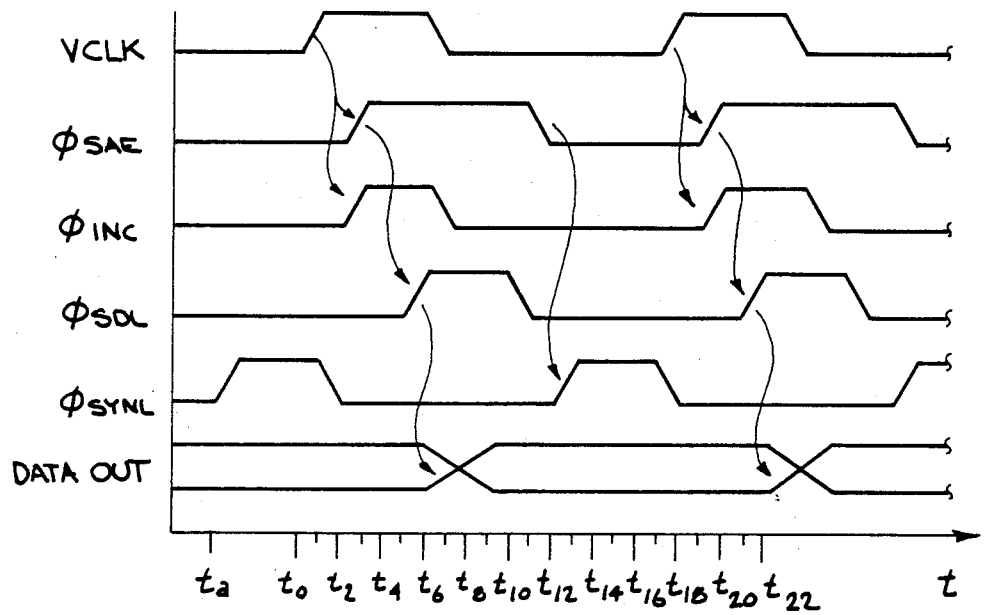

The operation of the SRAM/data line unit 50 is best understood when considered in conjunction with the timing diagram of FIG. 3b. The externally provided video clock signal, $V_{CLK}$, is utilized to initiate each data bit cycle, $t_0$-$t_{16}$. Thus, the sense amplifier enable and counter increment signals, $\phi_{SAE}$, $\phi_{INC}$, are preferably generated at $t_2$ in response to the receipt of $V_{CLK}$ by the control logic 16. Since, during the previous data cycle, a decoder select signal was provided at about $t_a$ by the decoder 58 to a corresponding latch buffer 66, the corresponding one of the SRAM cells 72 is coupled to the differential data lines 78, 80 and, therefore, to the sense amplifier 90 via the differential sense lines 82, 84. The sense amplifier 90 may then begin sensing the data state established by this earlier selected SRAM cell 72 at $t_2$. At the same time, the provision of $\phi_{INC}$ increments the counter 54 to cause the decoder 58 to select another decoder output line 60. By the presence of the pass gate 62 and the state of the synchronization latch signal $\phi_{SYNL}$, the previously selected SRAM cell 72 remains selected. Similarly, the data stored in the latched buffer 102 remains available on the output line 104 until the $\phi_{SDL}$ signal, at $t_5$, is provided on the gate control line 100 of the pass gate 98. The time period between $t_2$ and $t_5$ is preferably sufficient for the data sensed by the sense amplifier 90 to be amplified and then buffered by the buffer 96 to within acceptable logic level limits. This data is provided through the pass gate 98 to the latched buffer 102 between $t_5$ and $t_6$. Thus, following $t_6$, the data present on the output line 104 changes to reflect the new data present in the latched buffer 102. When the data present in the latched buffer 102 has settled and latched, between $t_8$ and $t_{11}$, the $\phi_{SDL}$ signal is removed at $t_{11}$. In quick succession, between $t_{11}$ and $t_{13}$ the $\phi_{SAE}$ signal is removed, disabling the sense amplifier 90, and the $\phi_{SYNL}$ signal is provided to enable the latching of the select signal from an output 60 of the decoder 58 to the corresponding lath buffer 66. After a settle and latch period, between $t_{13}$ and $t_{17}$, the $\phi_{SYNL}$ signal is removed.

An advantage evidenced by the present invention is a decreased access time for the specification and retrieval of data from a selected SRAM cell 72. As shown in FIG. 3b, the selection of the desired SRAM cell 72 is completed largely during the prior data cycle as illustrated by the $\phi_{SYNL}$ signal between $t_a$ and $t_2$. Thus, the minimum access time is substantially determined by the minimum required time between the provision of $\phi_{SAE}$ signal at $t_2$, enabling the sense amplifier 90, and the appearance of the data on the data output line 104 at about $t_8$. However, valid data is held on the data output line 104 until the provision of the $\phi_{SDL}$ signal and is invalid essentially only for the propagation delay period of the latched buffer 102, $t_{6-8}$. Thus, the present invention also maximizes the portion of each video clock period that valid data is present on the data output line 104.

Figure 4A:
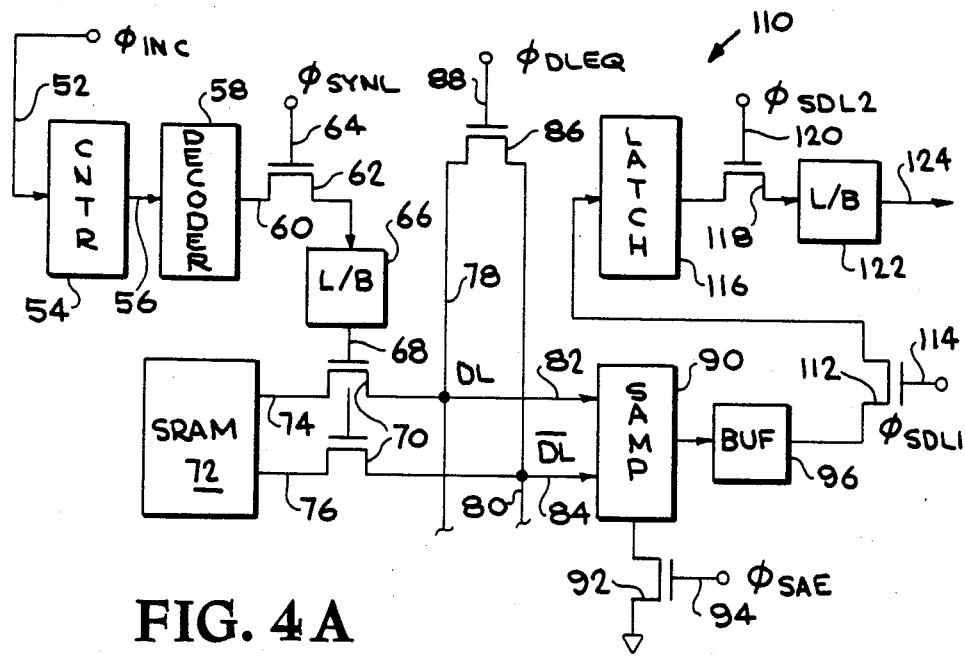
FIGS. 4a and 4b provide a detailed block diagram and graphical representation, respectively, of the operation of a second preferred embodiment of the present invention.

A second embodiment 110 of the present invention is shown in FIG. 4a. As in the first embodiment 50, a counter 54 and decoder 58 are jointly used to provide an SRAM select signal on a corresponding one of the decoder output lines 60. The decoder output lines 60 are again coupled through respective pass gates 62 to latched buffers 66 and differential SRAM data pass gates 70 that, in turn, couple respective SRAM cells 72 to the data lines 78, 80. The sense amplifier 90 is coupled between the data lines 78, 80, by the differential sense amplifier input lines 82, 84, and the buffer 96.

The output of the buffer 96 is, however, preferably coupled through a pass gate 112, selectively activated by a first sense data latch signal ($\phi_{SDL1}$) provided on the gate control line 114, and a latch 116. The output of the latch 116 is, in turn, coupled through another pass gate 118 to the latch buffer 122. The pass gate 118 is selectively activated by a second sense data latch signal ($\phi_{SDL2}$) provided on a gate control line 120. The data received and stored by the latch buffer 122 is then provided on the serial output line 124 for transfer to the serial port.

Figure 4B:
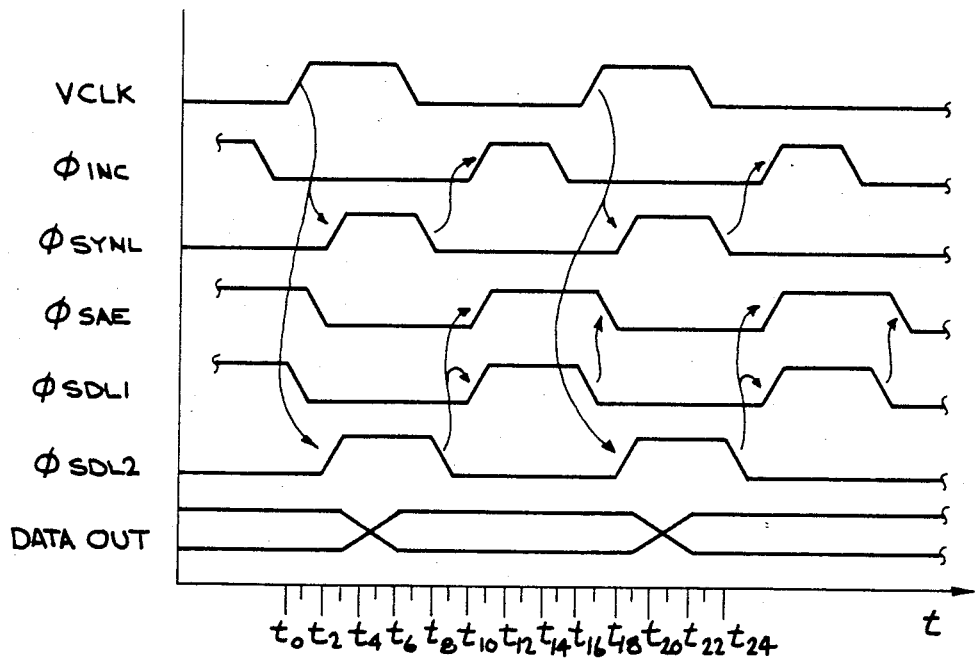

The operation of the second preferred embodiment 110 of the present invention is illustrated by the timing diagram of FIG. 4b. As shown, a video clock period begins at $t_0$ and ends at $t_{16}$. The rising edge of the $V_{CLK}$ signal at $t_0$ is used as a reference for the provision of the $\phi_{SDL2}$ signal at $t_2$. Thus, the data present in the latch 116 is provided on the serial output line 124, slightly delayed through the latch buffer 122, beginning at $t_2$ and maintained there through $t_{21}$. In preparation for the next video clock cycle, the $\phi_{SYNL}$ signal is also provided at $t_2$ to pass the decoder outputs to their corresponding latch buffers 66. Thus, the data present in the SRAM cell 72 corresponding to the select signal provided by the decoder 58 is set up on the differential data lines 78, 80 as passed there via the differential data pass gates 70.

Shortly before $t_{10}$, the $\phi_{SYNL}$ and $\phi_{SDL2}$ signals are withdrawn and, at $t_{10}$, the $\phi_{INC}$, $\phi_{SAE}$ and $\phi_{SDL1}$ signals are provided. The count value of the counter 54 is incremented in response to the $\phi_{INC}$ signal and the new count value is provided to the decoder 58. The newly decoded SRAM select signal present at the output 60 of the decoder 58 is prevented from changing the currently selected SRAM cell 72 by the presence of the pass gate 62, when in the "OFF" state.

Meanwhile, the $\phi_{SAE}$ signal enables the operation of the sense amplifier 90 and the $\phi_{SDL1}$ signal enables the passage of the sensed and amplified data to and through the buffer 96 to the latch 116. The time between $t_{10}$ and $t_{16}$ is preferably sufficient to allow the sense amplifier to set up the data sensed from the differential data lines 78, 80 and to further allow the data to stabilize in the latch 116. Thus at $t_{16}$, when the $\phi_{SDL1}$ signal is removed, the sensed data is properly retained in the latch 116. The $\phi_{SAE}$ signal may then be removed as shown occurring at $t_{18}$. At this point, new data is present in the latch 116 for subsequent transfer to the latch buffer 122 and from there to the serial port via line 124.

Similar to the first embodiment, the second embodiment of the present invention provides for the rapid transfer of new data to the serial port at the beginning of each video clock period. The time required for this transfer is the time difference between the application of the $\phi_{SDL2}$ signal, for example at $t_{18}$, and the appearance of the new data on the serial data line 124 at $t_{21}$. Also similar to the first embodiment 50, the second embodiment of the present invention is capable of providing new data at a rate ultimately limited only by the minimum sense amplifier 90 sense time requirement, illustrated as the period between $t_{10}$ and $t_{16}$. Advantageously, the sense period of the sense amplifier 90 is exclusive of the time necessary to set up the data from a selected SRAM cell 72 on the data lines 78, 80 and, further, is exclusive of the time necessary to drive and stabilize the amplified data into a latched buffer. Rather, the latch 166 can be speed optimized for receiving the data without compromising the power driving requirement necessary for the subsequent provision of that data on the output line 124. This latter function is separately addressed by the latched buffer 122.

Figure 5A:
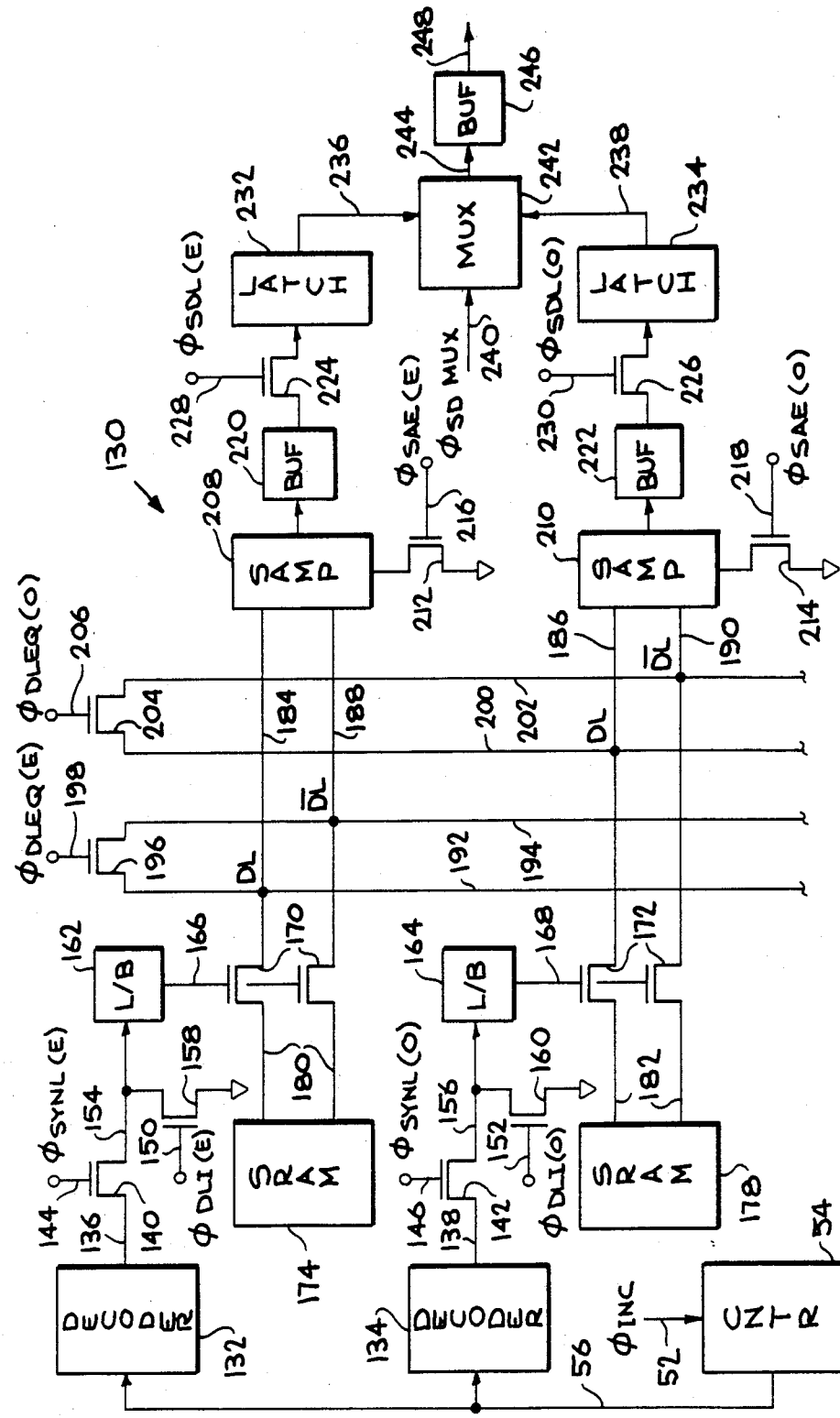
FIGS. 5a and 5b provide a detailed block diagram and graphical illustration, respectively, of the operation of a third preferred embodiment of the present invention.

A third preferred embodiment 130 of the present invention is shown in FIG. 5a. Preferably, the third embodiment 130 is divided into two functional halves, hereinafter designated as even and odd. As before, a programmable counter 54 is employed to provide a sequence of count values (addresses) corresponding to the static RAM cells that are to be accessed. However, the count value is provided by the counter 54 to even and odd decoders 132, 134 via the common lines 56. From the value received, the selected decoder 132 or 134 provides an SRAM select signal on a corresponding one of its respective plural output lines 136, 138. These SRAM select signals are coupled from the decoders 132, 134 to respective even and odd latched buffers 162, 164, shown for convenience as corresponding to the particular output lines 136, 138 provided with the SRAM select signals. An even or odd select signal is passed via the pass gates 140, 142 when allowed by the provision of gate enable signals ($\phi_{SYNL(E)}$, $\phi_{SYNL(O)}$) on lines 144 and 146 respectively. Even and odd selection inhibit gates 158, 160 are coupled to the even and odd latch buffer input lines 154, 156 to disable the latched buffers 162, 164, and thereby effectively blocking the transfer of data from SRAM cells 174 and 178 to their respective differential data lines 192, 194 and 200, 202. The selection inhibit gates 158, 160 are operable in response to respective inhibit signals ($\phi_{DLI(E)}$, $\phi_{DLI(O)}$) as provided on control lines 150, 152. However, should an SRAM select signal be allowed to be latched by the latched buffers 162 or 164, the select signal is then applied to the control inputs 166, 168 of respective even and odd pairs of differential pass gates 170, 172. Each pair of differential pass gates 170, 172 is coupled between an SRAM cell 174, 178, via respective differential bit lines 180, 182, to either one of two differential data lines 192, 194 and 200, 202. In accordance with the present invention, all of the even SRAM cells 174, as associated with the even decoder 132, are coupled via respective differential pass gates 170 to the even differential data lines 192, 194. Conversely, the odd SRAM cells 178 associated with the odd decoder 134 are preferably coupled via respective differential pass gates 172 to the odd differential data lines 200, 202.

Each of the differential data lines are, in turn, coupled to even and odd sense amplifiers 208, 210 via the sense amplifier differential input lines 184, 188 for the even sense amplifier 208 and 186, 190 for the odd sense amplifier 210.

The even and odd sense amplifiers 208, 210 are provided with enable gates 212, 214 for respectively enabling the sense amplifiers 208, 210 upon application of sense amplifier enable signals ($\phi_{SAE(E)}$, $\phi_{SAE(O)}$) to the respective enable control lines 216, 218. When enabled, the sense amplifiers 208, 210 provide their sensed and amplified data to respective even and odd buffers 220, 222 and then via even and odd pass gates 224, 226, to respective even and odd latches 232, 234. The pass gates 224, 226 are respectively enabled by sense data latch enable signals ($\phi_{SDL(E)}$, $\phi_{SDL(O)}$) as provided on the respective gate control lines 228, 230. The latches 232, 234 are, in turn, coupled to a multiplexer 242 by respective even and odd multiplexer data input lines 236, 238. The data is multiplexed by the multiplexer 242 in response to a sense data multiplexer control signal ($\phi_{SDMUX}$) provided on the multiplexer control line 240. A data buffer 246 receives the data from the multiplexer 242 via a multiplexer output line 244. The multiplexed and buffered data is then driven onto the serial port output line 248.

Figure 5B:
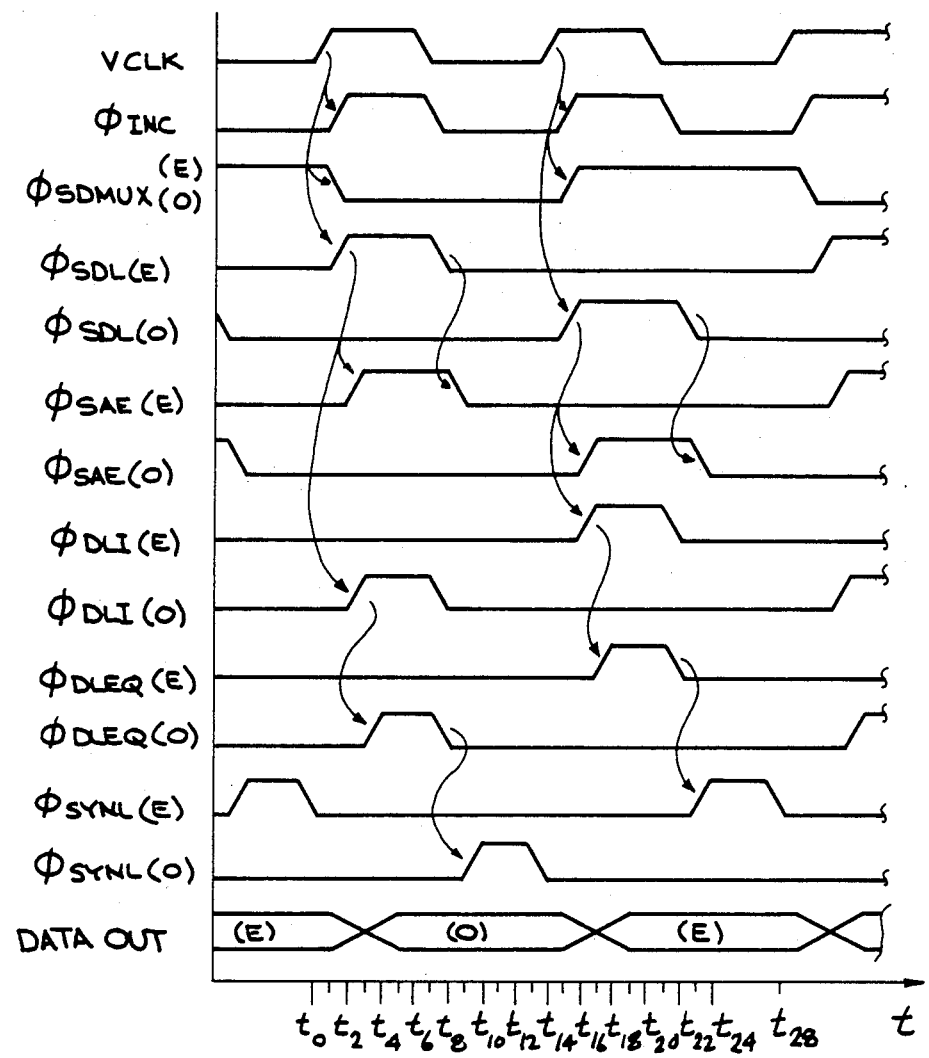

Reference is now made to the timing diagram of FIG. 5b in order to describe the preferred operating mode of the third embodiment 130 of the present invention. In overview, the multiplexer 242 is utilized to permit the substantial parallel operation of the even and odd portions of the third embodiment 130 during alternate video clock periods. As shown in FIG. 5b, a first $V_{CLK}$ period begins at $t_0$ and extends through $t_{14}$. In response to the rising edge of the $V_{CLK}$ signal, the $\phi_{SDMUX}$ signal changes at $t_1$, for example, to select the data previously obtained and now present in the odd latch 234 for provision to the buffer 246. Accordingly, the data present on the serial port output line 248 changes at $t_3$ to reflect the data present in the odd latch 234. This data remains present on the serial output line 248 until $t_{15}$ or for substantially one video clock period.

In parallel with the sourcing of data from the odd latch 234, beginning at $t_1$, the $\phi_{INC}$ signal is provided on line 52 of the counter 54 to cause the next counter incremented value to be provided to the even and odd decoders 132, 134. In turn, the correspondingly decoded output lines of the decoders 132, 134, providing the SRAM select signals, change to reflect the new counter value. However, in absence of both the $\phi_{SYNL(E)}$ and $\phi_{SYNL(O)}$ signals, the previous SRAM select signals latched in their corresponding latched buffers 162, 164 are not as yet altered.

Closely following the change of state of the $\phi_{SDMUX}$ signal at $t_3$, the $\phi_{SDL(E)}$ signal is provided to the control line 228 of the pass gate 224 to enable the passage of data only from the even buffer 220 to the even latch 232. The even sense amplifier 208 is then enabled by the provision of the $\phi_{SAE(E)}$ signal on the control line 216 of the gate 212. At this point, the data from a selected even SRAM cell 174 will have been passed via corresponding pass gates 170 to the even data bit lines 192, 194, the data is also present and stable on the even differential sense amplifier input lines 184, 186. Thus, the even sense amplifier 208 can immediately begin sensing the data rom its differential sense amplifier input lines 184, 188. At the conclusion of a sense amplifier sense period sufficient to have set up the sensed data and pass the data through the buffer 220 to the latch 232, the $\phi_{SDL(E)}$ signal is withdrawn so as to effectively isolate the data latched in the latch 232 from the buffer 220. Once isolated, the $\phi_{SAE(E)}$ signal is withdrawn at $t_8$ from the sense amplifier enable gate 212. Consequently, following $t_7$ the data present in the latch 232 is present and available for the multiplexer 242 to direct onto the serial output line 248.

Preferably, between $t_3$ and $t_9$, the odd decoder 134 is allowed to settle for the decoded selection of a corresponding odd SRAM cell 176. Additionally, the prior contents of each of the latch buffers 164 are cleared and the odd differential data lines are equalized in preparation for the next odd data sensing operation. This is described in greater detail below. Between $t_9$ and $t_{14}$, the $\phi_{SYNL(O)}$ signal is provided to latch the select signal from the odd decoder 134 into a corresponding latch buffer 164. Selection of data from a corresponding odd SRAM cell 178, therefore, begins generally between $t_9$ and $t_{14}$.

Immediately following the beginning of the next $V_{CLK}$ cycle, at $t_{14}$, the state of the $\phi_{SDMUX}$ signal is again reversed to select the data present in the even latch 232 for output while freeing the odd latch 234 to acquire new data. Thus, at $t_{15}$, the $\phi_{SDMUX}$ signal changes and the $\phi_{INC}$ and $\phi_{SDL(O)}$ signals are provided. The count value provided by the counter 54 is incremented and subsequently reflected, significantly, by the even decoder 132 with the select signal being provided on a newly corresponding one of the decoder output lines 136. However, the off state of the $\phi_{SYNL(E)}$ signal provided on the gate control line 144 again prevents the even latch buffer 162 from being updated as yet. Meanwhile, the selected odd SRAM cell 178 has transferred its data from the differential SRAM bit lines 182 to the odd differential data lines 200, 202 via the pass gates 172 as enabled in response to the removal of the $\phi_{SYNL(O)}$ signal therefrom. As such, the data provided by the selected odd SRAM cell 178 is present and stable on the differential sense amplifier input lines 186, 190 as coupled between the differential data lines 200, 202 and the odd sense amplifier 210 at about $t_{16}$. Accordingly, the odd sense amplifier 210 is preferably enabled by the provision of the $\phi_{SAE(O)}$ signal on a gate control line 218 of the sense amplifier enable gate 214 at $t_{16}$. The odd sense amplifier 210 therefore begins to sense data corresponding to the data from the differential data lines 200, 202. The sensed data is passed via the buffer 222 and pass gate 226 to the odd latch 234. Once the odd data is set up and stable within the odd latch 234, at $t_{23}$, the $\phi_{SDL(O)}$ signal is withdrawn to isolate the data held by the odd latch 234 from the buffer 222. The $\phi_{SAE(O)}$ signal is then withdrawn, as shown at $t_{24}$. Consequently, data is properly present and available in the odd latch 234 for the next video clock period for output on the serial port line 248 via the multiplexer 242 and buffer 246.

Again preferably, between $t_{16}$ and $t_{22}$, the even decoder 132 is allowed to settle for the decoded selection of a corresponding even SRAM cell 174. Also, the prior contents of the latch buffers 162 are cleared and the even differential data lines are equalized in preparation for the next even data sensing operation. At about $t_{22}$, with the provision of the $\phi_{SYNL(E)}$ signal, the selection of a corresponding even RAM cell 174 begins.

In concert with the foregoing operation of the third embodiment 130 of the present invention, a number of control signals are utilized to enable low power operation and improve sense amplifier sensitivity. As shown in FIG. 5b, the $\phi_{DLI(O)}$ signal is provided at $t_2$ to remove the select signal latched by the latched buffers 164 and, thereby, force off the selection of all of the odd SRAM cells 178. Closely following at $t_3$, the $\phi_{DLEQ(O)}$ signal is provided on the control line 206 of the equalization gate 204. Thus, for a period shown in FIG. 5b as preferably extending from $t_3$ through $t_8$, the differential data lines 200, 202 are equalized to a mid-point bias potential between the high and low binary logic levels. Following the withdrawal of both the $\phi_{DLEQ(O)}$ and $\phi_{DLI(O)}$ signals at about $t_8$, the $\phi_{SYNL(O)}$ signal is provided at $t_9$ to allow the select signal provided by the odd decoder 134 to be latched into a corresponding one of the latch buffers 164. Consequently, the data present in the corresponding odd SRAM cell 178 is then coupled to the equalized differential data lines 200, 202. Naturally since the differential data lines 200, 202 have been equalized, the power driving and handling requirements of the odd SRAM cell 178 are directly reduced. Similarly, the sensitivity of the odd sense amplifier 210 may be increased to take advantage of the initially equalized voltage level present on the differential data lines 200, 202.

Similarly, during the next video clock cycle the $\phi_{DLI(E)}$ signal is provided on the control line 150 of the gate 158 to force off the selection of all of the even SRAM cells 174. Then, at $t_{17}$, the $\phi_{DLEQ(E)}$ signal is provided on the control line 198 of the equalization gate 196. Between $t_{17}$ and $t_{22}$, the even differential data lines 192, 194 are equalized to a mid-point bias potential. Following the withdrawal of the $\phi_{DLI(E)}$ and $\phi_{DLEQ(E)}$ signals at $t_{22}$, the $\phi_{SYNL(E)}$ signal is provided on the control line 144 of the select pass gates 140 to enable the latching of the select signal provided from the even decoder 132 to a corresponding one of the latched buffers 162. Again, the power handling and driving capacity of the even SRAM cells 174 are reduced and the sense sensitivity of the even sense amplifier 208 can be increased.

Finally, the sense amplifiers 208, 210 generally have significant power requirements for their proper operation. The present invention provides for the operation of only one of the even and odd sense amplifiers 208, 210 during each video clock period. Thus, there is no significant power related penalty incurred by the present invention as a result of utilizing the separate even and odd sense amplifiers 208, 210.

The third embodiment 130 of the present invention achieves a significant advantage in that it effectively removes the SRAM access and sense amplifier sensing times as limiting factors in determining the rate at which serial data can be provided on the serial port line 248. Each even or odd SRAM access and sensing is advantageously performed during alternate video clock cycles with the provision of its prior accessed and sensed data. Also, generally as in the first and second embodiments of the present invention, the latency in providing new data on the serial port line 248 is dependent only on the switching speed of the multiplexer 242 and data transfer delay through the buffer 246. Thus, new data is available on the serial port line 248 for substantially all of each video clock period. Consequently reduction in the duration of the video clock period can generally be made to the limiting rate at which the counter 54 can be updated in response to the $\phi_{INC}$ signal. This is in large part due to the optimized nature of the SRAM cells 174, 178, the increased sensitivity and, therefore, shortened sensing period required by the sense amplifiers 208, 210 and the alternating operation of the even and odd functional portions of the third embodiment 130.

Figure 6A:
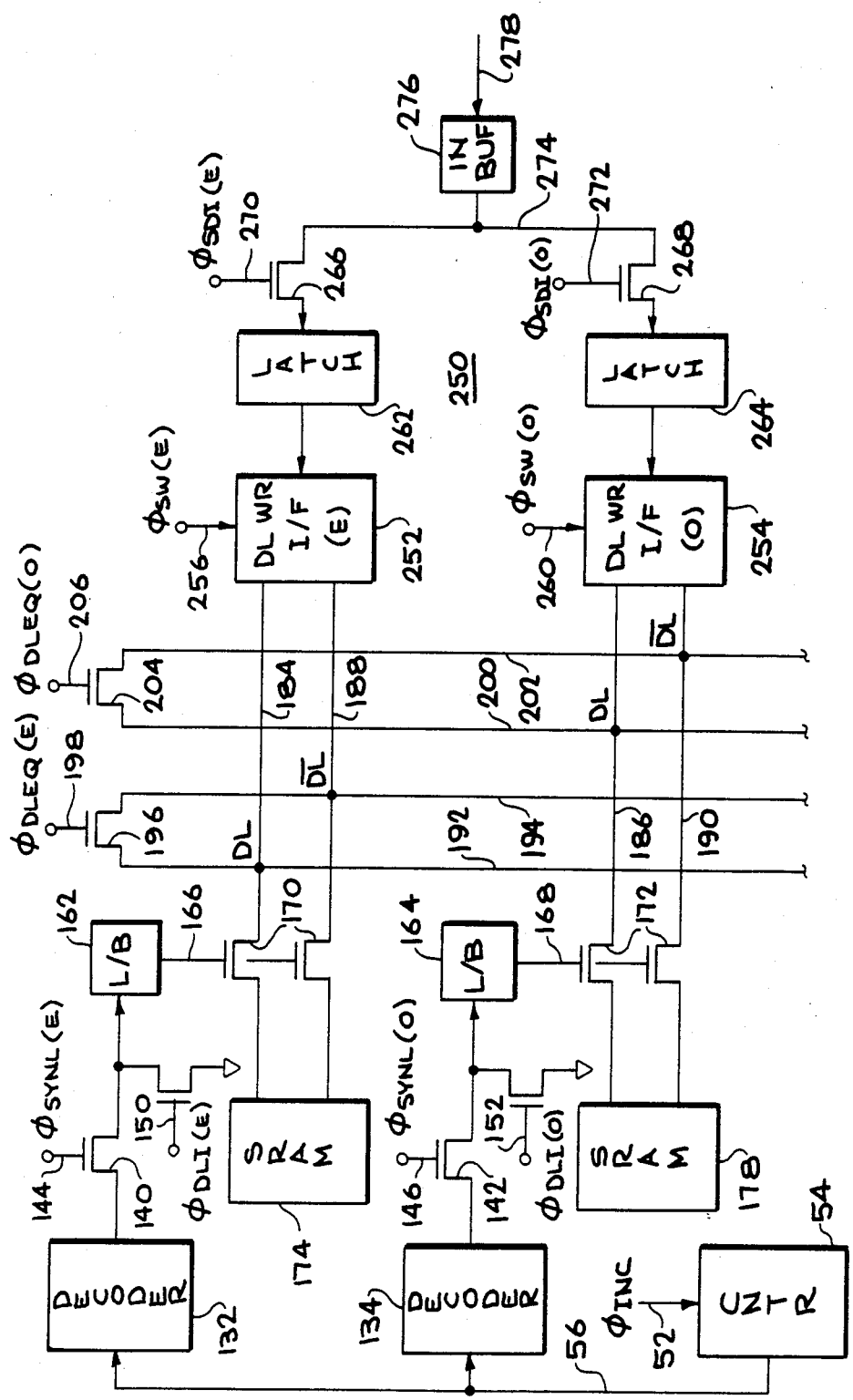
FIGS. 6a and 6b provide a detailed block diagram and graphical illustration, respectively, of the operation of a preferred write data path for the third preferred embodiment of the present invention.

Considering now FIG. 6a, there is shown a preferred write circuit 250 for receiving data from the serial port via a serial port line 278 and appropriately providing the data to the even and odd differential data lines 192, 194 and 200, 202 respectively for storage in the corresponding even and odd SRAM cells 174, 178. The write circuit 250 includes an input buffer 276 for receiving the incoming serial port data and, in turn, providing the data to the even and odd latches 262, 264. The transfer of data between the input buffer 276 and latches 262, 264 is selectively passed by the even and odd pass gates 266, 268 in response to respective gate control SRAM data input latch signals ($\phi_{SDIL(E)}$, $\phi_{SDIL(O)}$) as provided on the gate control lines 270, 272, respectively. The data stored by the even and odd latches 262, 264 is provided to respective data line write interfaces 252, 254. These even and odd interfaces 252, 254 are enabled in response to SRAM write enable signals ($\phi_{SW(E)}$, $\phi_{SW(O)}$) as provided on respective write control lines 256, 260. The even and odd data line write interfaces 252, 254 preferably provide for the differential driving of data onto the respective even and odd differential data lines 192, 194 and 200, 202. Accordingly, any selected even and odd SRAM cells 174, 178 may be written with data from their respective differential data lines 192, 194 and 200, 202 by the provision of a select signal in their corresponding even and odd latched buffers 162, 164. As before, the programmable counter 54 provides a count value on lines 56 to the decoders 132, 134 that, when decoded provides a select signal on a corresponding output line of the decoders 132, 134. The select signals are coupled through respective even and odd pass gates 140, 142 to the buffers 162, 164 when enabled by even and odd select control signals ($\phi_{SYNL(E)}$, $\phi_{SYNL(O)}$)

Figure 6B:
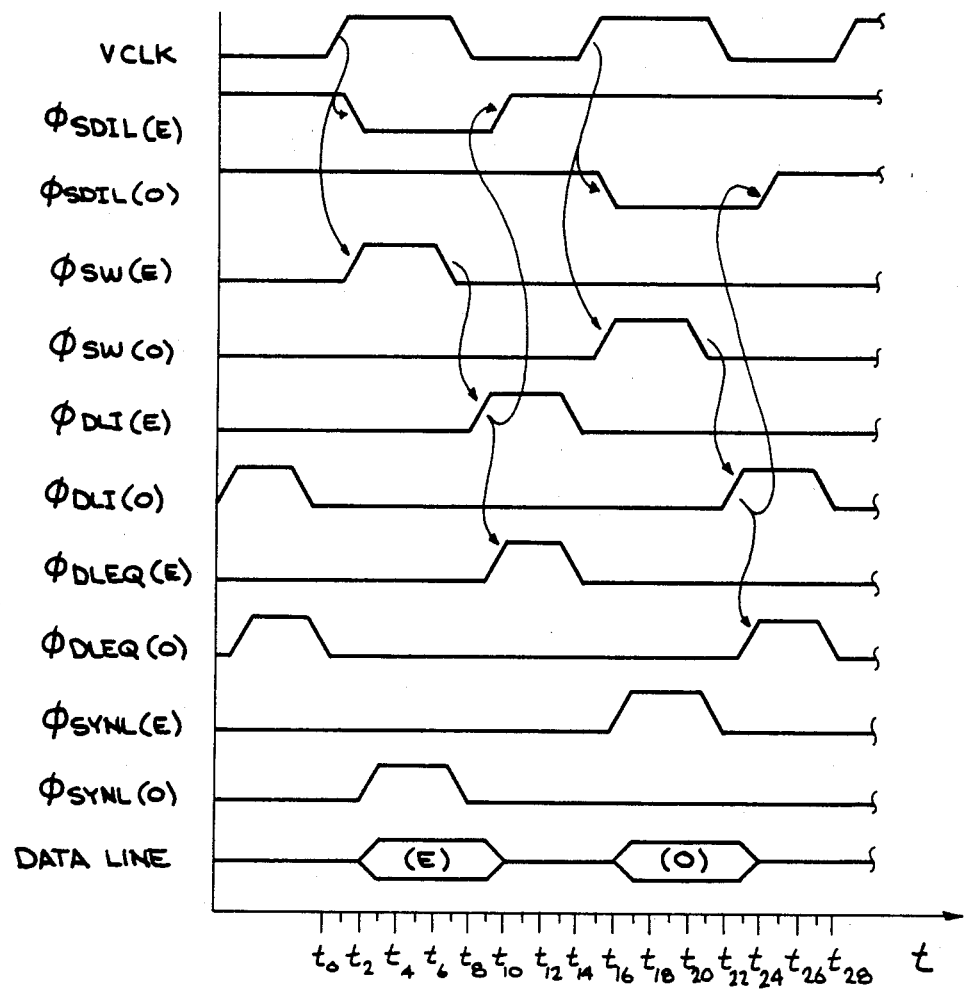

The preferred mode of operation of the write circuit 250 is illustrated in FIG. 6b. In a video clock cycle beginning at $t_0$ a data bit designated as even is to be written into a corresponding even SRAM cell 174. In detail, the rising edge of the $V_{CLK}$ signal is used as a reference for the withdrawal at $t_1$ of the $\phi_{SDIL(E)}$ signal and a simultaneous provision of the $\phi_{SW(E)}$ signal. The withdrawal of $\phi_{SDIL(E)}$ signal disables the SRAM data-in pass gate 266 with the result that the data set up and latched by the even latch 262 is prevented from subsequently changing at least until the $\phi_{SDIL(E)}$ signal is again provided on the control line 270, shown as occurring at $t_9$. The data present in the even latch 262 is received by the even data latch write interface 252 and, in response to the $\phi_{SW(E)}$ signal provided on the interface enable control line 256, differentially drives the data onto the even differential data lines 192, 194. The data is then coupled through the pass gates 170 to the selected even SRAM cell 174 for storage therein. As shown in FIG. 6b the data is driven onto the even data lines 192, 194 at about $t_3$ and remains until about $t_{10}$. At $t_7$, the $\phi_{SW(E)}$ signal is withdrawn and the $\phi_{DLI(E)}$ signal is provided at $t_8$. This results in the select signal being cleared from the corresponding even latched buffer 162 and the decoupling of the previously selected SRAM cell 174 from the even data lines 192, 194 by the pass gates 170. Thus, the data set up and present in the even SRAM cells 174 is preserved. At $t_9$, a $\phi_{DLEQ(E)}$ signal is provided on the control line 198 of the equalization gate 196. Accordingly, the data present on the even differential data lines 192, 194 is equalized at $t_{10}$ to a mid-point bias potential. Finally, both the $\phi_{DLI(E)}$ and $\phi_{DLEQ(E)}$ signals are withdrawn at about $t_{14}$ to complete the even data writing operation of the video clock cycle.

An odd data write video clock cycle also begins at $t_{14}$ with the rising edge of the $V_{CLK}$ signal. Accordingly, the $\phi_{SDIL(O)}$ signal is withdrawn and the $\phi_{SW(O)}$ signal is provided. Thus, the data set up and present in the odd latch 264 is isolated from further change in response to data provided through the input buffer 276. The odd data present in the latch 264 is received by the odd data line write interface 254 and, as enabled by the $\phi_{SW(O)}$ signal on the interface enable control line 260, diffrentially drives the data onto the odd differential data line 200, 202. An odd SRAM cell 178 selected during the previous video clock cycle is coupled to the odd differential data lines 200, 202 by the differential pass gates 172. Thus, as data is driven onto the odd differential data lines 200, 202, the selected odd SRAM cell 178 also receives the data beginning at about $t_{16}$. The $\phi_{SW(O)}$ signal is then preferably removed at about $t_{20}$ followed, at about $t_{22}$, by the provision of the $\phi_{DLI(O)}$ signal. The latched buffer 164 corresponding to the select signal is therefore cleared and the differential pass gates 172 are switched off. The data set up and written within the previously selected odd SRAM cell 178 is therefore isolated. The data present on the data lines 200, 202 is then preferably removed by the provision of the $\phi_{DLEQ(O)}$ signal at about $t_{21}$. This results in the odd differential data lines 200, 202 being equalized to a midpoint bias potential. Finally the $\phi_{DLI(O)}$ and $\phi_{DLEQ(O)}$ signals are withdrawn at the conclusion of the odd data write clock period ending at $t_{28}$.

As provided by the write circuit 250 of FIG. 6a, the present invention provides for the bi-directional transfer of data to and from a serial port at equivalent serial data rates. Additionally, the write data path advantageously utilizes a large portion of the SRAM cell array select circuitry while requiring the addition of only the modestly complex write circuit 250 in order to support the write data transfers.

Thus, a high speed, bi-directional SRAM based data serializer, realizable in a variety of embodiments that each support significantly improved serial data transfer rates and provide for extremely rapid transitions between serial data bits, has been described.

Accordingly, as the foregoing disclosure relates only to the preferred embodiments of the present invention and as various modifications are contemplated and may be obviously resorted to by those skilled in the art without departing from the nature and scope of the present invention, it is therefore to be understood that, within the scope of the appended claims, the present invention may be practiced otherwise than as specifically described above.

We claim:

1. Apparatus for storing data and for providing data serially at high data rates, said apparatus comprising:
   (a) means for storing data at a plurality of memory locations;
   (b) means, responsive to a first enabling signal, for sensing data stored by said storing means, said sensing means provided sensed data;
   (c) means, responsive to a second enabling signal, for selectively coupling a memory location of said storing means to said sensing means to permit the sensing of the data stored thereby;
   (d) means, responsive to a third enabling signal, for latching said sensed data, said latching means being coupled to said sensing means;

(e) means, responsive to a fourth enabling signal, for generating an address signal identifying a memory location of said storing means, said generating means providing said address signal to said selectively coupling means; and (f) control means for providing said first, second, third and fourth enabling signals, said control means providing said first, second, third and fourth enabling signals such that:

(i) said generating means generates a first predetermined address signal while said selectively coupling means couples said sensing means to sense the data at a memory location corresponding to a second predetermined address signal, said second predetermined address signal having been generated prior to said first predetermined address signal, and said latching means receives the sensed data corresponding to said second predetermined address signal; and (ii) said latching means latches said sensed data corresponding to said second predetermined address signal at least until said selectively coupling means receives said first predetermined address signal and couples said sensing means to the memory location corresponding to said first predetermined address signal.

2. The apparatus of claim 1 wherein said latching means includes a first latch coupled to said sensing means for receiving sensed data and a second latch coupled to said first latch for receiving sensed data, wherein said first latch is responsive to said third enabling signal, wherein said second latch is responsive to a fifth enabling signal, and wherein said control means provides said fifth enabling signal such that said second latch latches the sensed data corresponding to a third predetermined address signal prior to the second data corresponding to said second predetermined address signal being received by said first latch, said third predetermined address signal having been generated prior to said second predetermined address signal.

3. Apparatus for storing data and for providing data serially at high video data rates, said apparatus comprising:

(a) first and second serializer units each including:
(i) means for storing data at a plurality of memory locations;
(ii) means, responsive to a first enabling signal, for sensing data stored by said storing means, said sensing means providing sensed data;
(iii) means, responsive to a second enabling signal, for selectively coupling a memory location of said storing means to said sensing means to permit the sensing of the data stored thereby;
(iv) means, responsive to a third enabling signal, for latching said sensed data, said latching means being coupled to said sensing means;

(b) means, responsive to an address control signal, for generating an address signal identifying a memory location of storing means of said first and second serializer units, said generating means providing said address signal to said selectively coupling means of said first and second serializer units;

(c) means, responsive to a multiplexor control signal, for multiplexing sensed data, said multiplexing means being coupled to the latching means of said first and second serializing units for the receipt of sensed data; and (d) control means for providing said first and second serializing units with respective ones of said first, second, and third enabling signals, said control means further providing said address control and said multiplexor control signals, said control means providing said first and second serializing units with respect ones of said first, second, third and fourth enabling signals such that for the respective first and second serializing units:

(i) said generating means generates a first predetermined address signal while said selectively coupling means couples said sensing means to sense the data at a memory location corresponding to a second predetermined address signal, said second predetermined address signal having been generated prior to said first predetermined address signal, and said latching means receives the sensed data corresponding to said second predetermined address signal; and (ii) said latching means latches said sensed data corresponding to said second predetermined address signal at least until said selectively coupling means receives said first predetermined address signal and couples said sensing means to the memory location corresponding to said first predetermined address signal.

4. The apparatus of claim 3 wherein said latching means includes a first latch coupled to said sensing means for receiving sensed data and a second latch coupled to said first latch for receiving sensed data, wherein said first latch is responsive to said third enabling signal, wherein said second latch is responsive to a fifth enabling signal, and wherein said control means provides said fifth enabling signal such that said second latch latches the sensed data corresponding to a third predetermined address signal prior to the sensed data corresponding to said second predetermined address signal being received by said first latch, said third predetermined address signal having been generated prior to said second predetermined address signal.

5. A high speed data serializer for providing multiple bit parallel serialized data during a memory cycle, said serializer comprising:

(a) a plurality of memory array planes, each said memory array plane including respective arrays of first and second memory cells, each said memory array plane providing a parallel bit of the multiple parallel bit serialized data;

(b) a plurality of first and second memory cell access selectors for providing access selection control data determinative of the memory cells of respective one of said memory array planes to be accessed during a predetermined memory cycle, each said first and second memory cells access selectors including a plurality of first latch means for storing said access selection control data;

(c) a plurality of first and second sense amplifier means, respectively coupled to said first and second memory cell access selectors, for sensing the data stored by the memory cells of respective ones of said memory array planes accessed during said predetermined memory cycle as determined in response to said access selection control data, each said first and second sense amplifier means including a plurality of second latch means for storing data sensed by said first and second sense amplifier means during said predetermined memory cycle;

(d) a plurality of data multiplexers having first and second data inputs and a multiplexed data output, said first and second multiplexer data inputs of each said data multiplexer being coupled to receive data from respective ones of said first and second sense amplifier means of a respective memory array plane, said multiplexed data outputs of said data multiplexers providing said parallel bits of the multiple bit parallel serialized data; and (e) control means for providing a plurality of control signals with respect to a series of memory cycles including a first control signal to initiate the generation of access selection control data during a memory cycle prior to said predetermined memory cycle, a second control signal, subsequent to said first control signal, to enable the latching of access selection control data by said first latch means, a third control signal, subsequent to said second control signal, to enable said sense amplifier means and said second latch means during said predetermined memory cycle and prior to provision of said second control signal with respect to a memory cycle subsequent to said predetermined memory cycle.

6. The high speed data serializer of claim 5 wherein said control means provides said first, second and third control signals to said first memory cell access selectors and said first sense amplifier means and to said second memory cell access selectors and said second sense amplifier means such that the respective memory cycles are offset, relative to one another by a half memory cycle.

7. The high speed data serializer of claim 6 further comprising:

(a) first and second data lines respectively coupling each of said first and second memory cell access selectors with each of said first and second sense amplifier means, said first and second data lines providing a transfer path for data from the selected ones of said first and second memory cells to their respective first and second sense amplifier means; and (b) means for clearing data from said first and second data lines during alternating half memory cycles, said clearing means being responsive to a fourth control signal, and wherein said fourth control signal is provided by said control means.

8. The high speed data serializer of claim 7 wherein each of the first and second sense amplifier means further comprises a plurality of third latch means for storing data sensed by said first and second sense amplifier means during a memory cycle prior to said predetermined memory cycle.

9. The high speed data serializer of claim 8 further comprising a plurality demultiplexers each having a data input for receiving high speed serialized data and first and second data outputs respectively coupled to said first and second data lines for providing demultiplexed serial data thereto.

10. The high speed data serializer of claim 9 wherein said plurality of first and second memory cell access selectors include a sequential count valve counter for generation of said access selection control data thereby.

11. The high speed data serializer of claim 10 wherein the initial sequential count value of each of said sequential count value counters is programmable.

* * * * *

UNITED STATES PATENT AND TRADEMARK OFFICE
CERTIFICATE OF CORRECTION

PATENT NO.   :  4,817,054
DATED        :  March 28, 1989
INVENTOR(S)  :  Banerjee, P. et al It is certified that error appears in the above-identified patent and that said Letters Patent is hereby corrected as shown below:

Column 8, Line 66:  Delete "rom" and insert therefor --from--

Column 14, Line 7:  Delete "respect" and insert therefor --respective--.

Column 14, Line 49: Delete "parallel bit" and insert therefor --bit parallel--

Column 16, Line 21: Delete "plurality demultiplexers" and insert therefor --plurality of data demultiplexers--

Signed and Sealed this

Twenty-seventh Day of March, 1990

Attest:

JEFFREY M. SAMUELS

*Attesting Officer*      *Acting Commissioner of Patents and Trademarks*